(12) United States Patent
Hsiao et al.

(10) Patent No.: US 12,464,801 B2
(45) Date of Patent: *Nov. 4, 2025

(54) CIRCUIT STRUCTURE WITH GATE CONFIGURATION

(71) Applicant: Taiwan Semiconductor Manufacturing Co., Ltd., Hsin-Chu (TW)

(72) Inventors: Ru-Shang Hsiao, Hsinchu County (TW); Ying Hsin Lu, Tainan (TW); Ching-Hwanq Su, Tainan (TW); Pin Chia Su, Tainan County (TW); Ling-Sung Wang, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/752,321

(22) Filed: Jun. 24, 2024

(65) Prior Publication Data

US 2024/0347614 A1    Oct. 17, 2024

Related U.S. Application Data

(63) Continuation of application No. 18/171,128, filed on Feb. 17, 2023, now Pat. No. 12,021,130, which is a
(Continued)

(51) Int. Cl.
| | |
|---|---|
| *H01L 29/423* | (2006.01) |
| *H01L 27/088* | (2006.01) |
| *H01L 29/40* | (2006.01) |
| *H01L 29/786* | (2006.01) |
| *H10D 30/67* | (2025.01) |
| *H10D 64/00* | (2025.01) |

(Continued)

(52) U.S. Cl.
CPC ....... *H10D 64/518* (2025.01); *H10D 30/6735* (2025.01); *H10D 30/6757* (2025.01); *H10D 64/112* (2025.01); *H10D 84/83* (2025.01)

(58) Field of Classification Search
CPC ............ H10D 64/518; H10D 30/6735; H10D 30/6757; H10D 64/112; H10D 84/83;
(Continued)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

FOREIGN PATENT DOCUMENTS

KR    20170112912 A    10/2017

*Primary Examiner* — Tong-Ho Kim
(74) *Attorney, Agent, or Firm* — HAYNES AND BOONE, LLP

(57) ABSTRACT

The present disclosure provides a semiconductor structure in accordance with some embodiment. The semiconductor structure includes a semiconductor substrate having a first circuit region and a second circuit region; active regions extended from the semiconductor substrate and surrounded by isolation features; first transistors that include first gate stacks formed on the active regions and disposed in the first circuit region, the first gate stacks having a first gate pitch less than a reference pitch; and second transistors that include second gate stacks formed on the active regions and disposed in the second circuit region, the second gate stacks having a second pitch greater than the reference pitch. The second transistors are high-frequency transistors and the first transistors are logic transistors.

20 Claims, 12 Drawing Sheets

Related U.S. Application Data continuation of application No. 17/175,368, filed on Feb. 12, 2021, now Pat. No. 11,588,038.

(60) Provisional application No. 63/001,922, filed on Mar. 30, 2020.

(51) Int. Cl.
 *H10D 64/27* (2025.01)
 *H10D 84/83* (2025.01)

(58) Field of Classification Search
 CPC ...... H10D 1/66; H10D 12/01; H10F 30/2863; H10F 77/955; A23B 2/783; A23B 2/754; A01G 13/33; H10B 10/12; H10H 20/851
 USPC .......................................................... 257/401
 See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,917,006 B1 * | 3/2018 | Cheng ................. H01L 21/845 |
| 10,109,646 B1 | 10/2018 | Badaroglu |
| 11,588,038 B2 | 2/2023 | Hsiao et al. |
| 12,021,130 B2 * | 6/2024 | Hsiao ................. H10D 64/112 |
| 2012/0286331 A1 | 11/2012 | Aton et al. |
| 2013/0187237 A1 | 7/2013 | Yu et al. |
| 2015/0115373 A1 | 4/2015 | Yu et al. |
| 2015/0206887 A1 | 7/2015 | Kuo et al. |
| 2016/0254260 A1 | 9/2016 | Sheen et al. |
| 2018/0277536 A1 | 9/2018 | Wu et al. |
| 2019/0148548 A1 | 5/2019 | Kao |
| 2019/0165096 A1 | 5/2019 | Kao et al. |
| 2019/0207103 A1 | 7/2019 | Pinarbasi et al. |
| 2019/0288690 A1 | 9/2019 | Yeap et al. |
| 2020/0185375 A1 | 6/2020 | Kim |
| 2020/0251594 A1 * | 8/2020 | Lee .................. H10D 64/021 |

* cited by examiner

CIRCUIT STRUCTURE WITH GATE CONFIGURATION

PRIORITY DATA

This application is a continuation of U.S. patent application Ser. No. 18/171,128 filed Feb. 17, 2023, which is a continuation of U.S. patent application Ser. No. 17/175,368 filed Feb. 12, 2021, which further claims priority to U.S. Provisional Patent Application Ser. No. 63/001,922 filed Mar. 30, 2020, the entire disclosures of which are hereby incorporated herein by reference.

BACKGROUND

Integrated circuits have progressed to advanced technologies with smaller feature sizes, such as 7 nm, 5 nm and 3 nm. In these advanced technologies, the gate pitch (spacing) continuously shrinks and therefore induces various performance and reliability concerns, such as overlay shift, contact to gate bridging issue, increased parasitic capacitance and circuit timing issue. Furthermore, three dimensional transistors, such as those formed on fin-type active regions, are often desired for enhanced device performance. Those three-dimensional field effect transistors (FETs) formed on fin-type active regions are also referred to as FinFETs. Other three-dimensional field-effect transistors include gate-all-around FETs. Those FETs are required narrow fin width for short channel control, which leads to smaller source/drain regions than those of planar FETs. This will further reduce the alignment margins and cause various issues for further shrinking device pitches and increasing packing density. Along with the scaling down of the device sizes, the existing circuit structures face various challenges including shorting, leakage, routing resistance, alignment margins, layout flexibility, and packing density. Therefore, there is a need for a structure and method for transistors to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
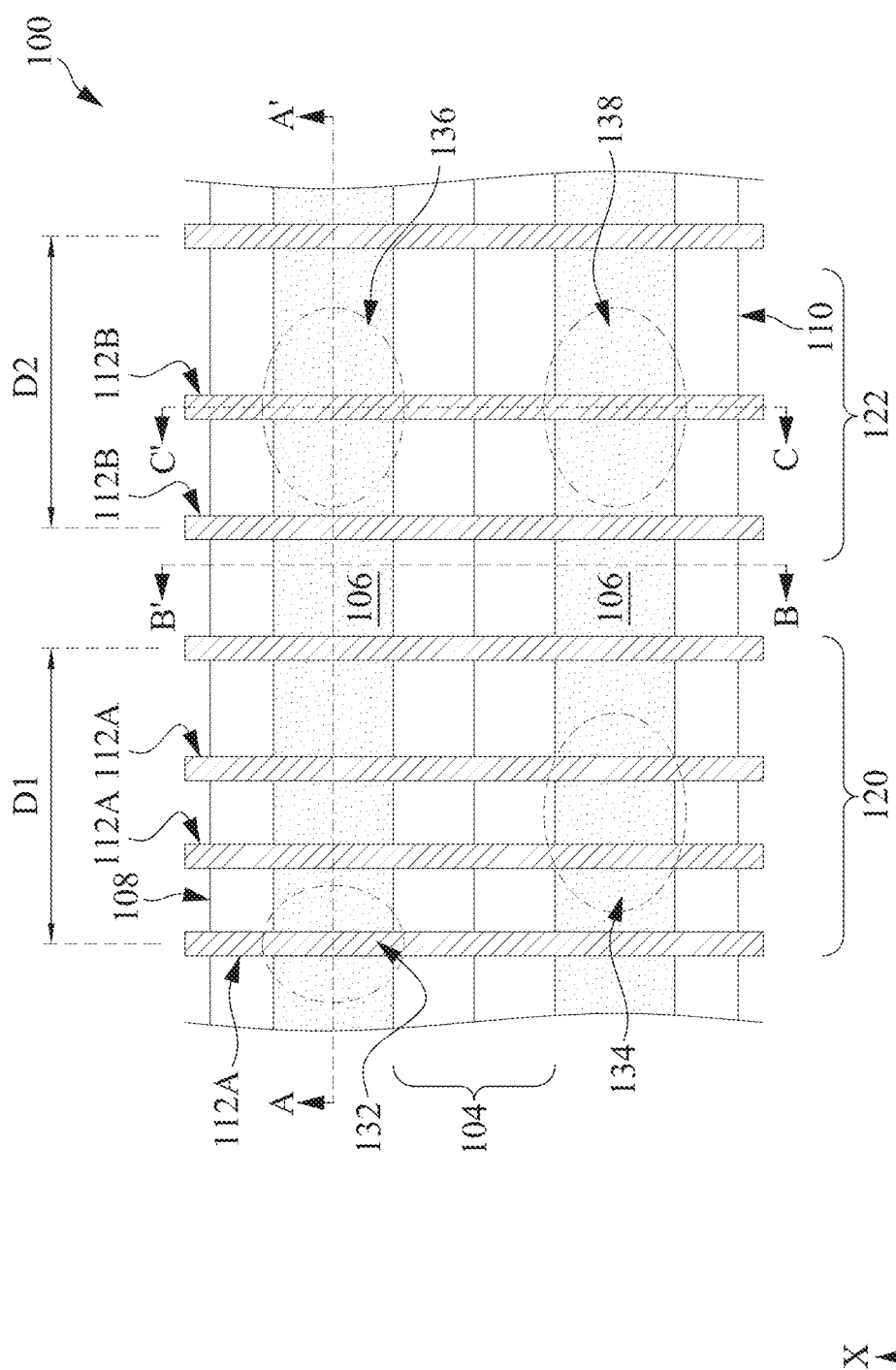
FIG. 1A is a top view of an integrated circuit (IC) structure constructed according to various aspects of the present disclosure in one embodiment.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

This application relates to a semiconductor circuit structure having field-effect transistors (FETs) and the fabrication process thereof, and more particularly to a multi-pitch gate. An integrated circuit includes various devices and various functional blocks integrated together. The different functional blocks or devices have different designs and performance requirements but are fabricated on a same chip. The fabrication is difficult to tailored to different functional blocks and therefore compromised the circuit performance. The general purposes of the present disclosure include designing a gate layout with multi-pitches tailored to respective functional blocks or different types of devices, such as logic devices and high-frequency devices. A general structure of a semiconductor circuit structure includes field-effect transistors with gates configured with different pitches. In one exemplary structure, the gate layout includes a first set of gates configured with a smaller pitch $P_s$ for logic devices and a second set of gates configured with a larger pitch $P_l$ for high-frequency devices, such as radio-frequency devices. The smaller pitch $P_s$ is less than a reference pitch and the larger pitch $P_l$ is greater than the reference pitch, which can be determined based various factors including circuit specification, device characteristics and fabrication technologies. In some embodiments, the reference pitch is determined according to fabrication technology and characteristics of the first and second transistors. In various embodiments, the gate layout in the semiconductor circuit structure includes different pitches, different dimensions (such as length and width), different gaps, different numbers of gates grouped, different compositions, different designs in the surrounding regions, different configuration or a combination thereof. In some examples, dummy gates are configured around a functional block with different configuration and different functions, such as dummy gates being configured around a high-frequency device block to function as a guard ring.

Furthermore, the different designs of the gates for different functional blocks combined with the fabrication loading effect generate different gate structures in different blocks. These differences include geometry, dimension, material profile and structure of the gates, which can be tuned to enhance the respective device performances. More details of the semiconductor circuit structure and the method making the same are provided in the attached drawings.

The present disclosure provides various embodiments of integrated circuit (IC) formed on a semiconductor substrate. The integrated circuit has a design layout that may be incorporated with various standard cells. The standard cells are predesigned IC structure to be repeatedly used in individual IC designs. Effective IC design layouts include various predesigned standard cells and predefined rules of placing those standard cells for enhanced circuit performing and reduced circuit areas.

Figure 1B:
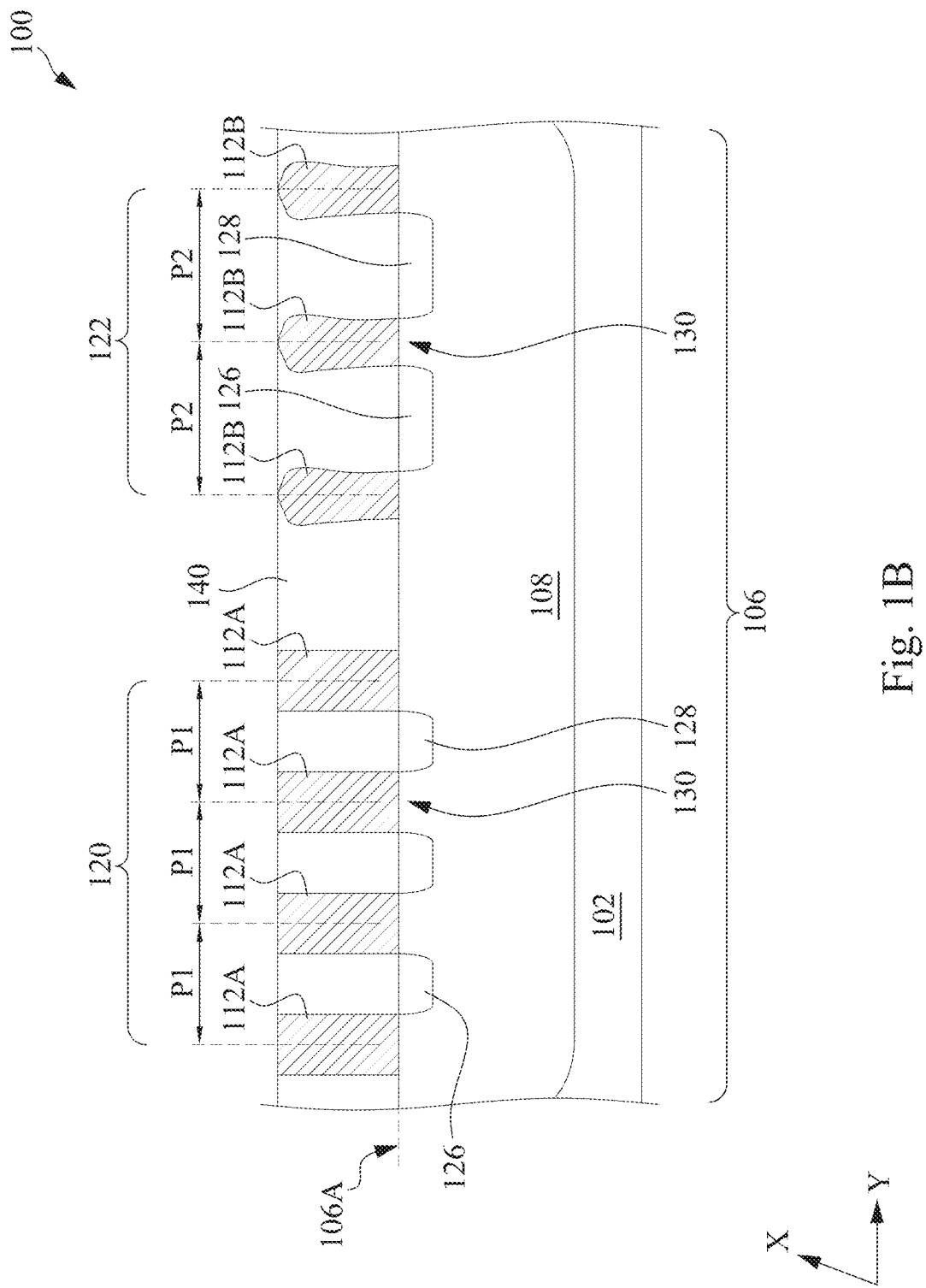
FIGS. 1B, 1C, 1D and 1E are sectional views of the IC structure of FIG. 1A, constructed according to various aspects of the present disclosure in one embodiment.
Figure 1C:
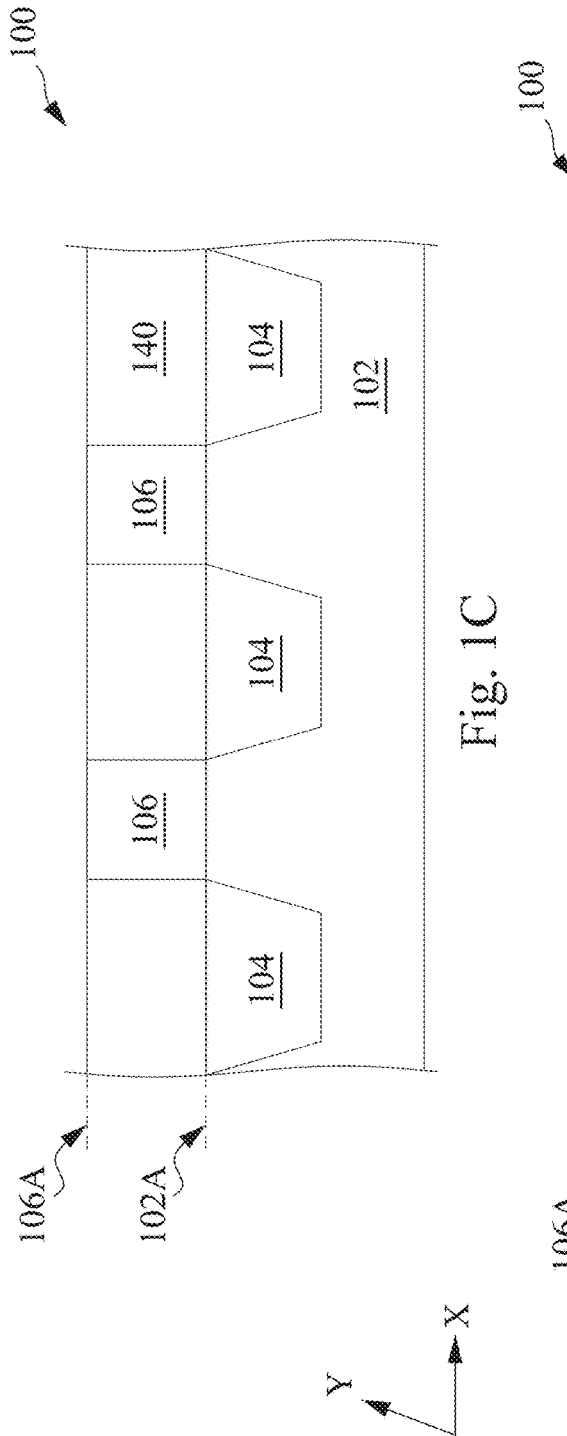
Figure 1D:
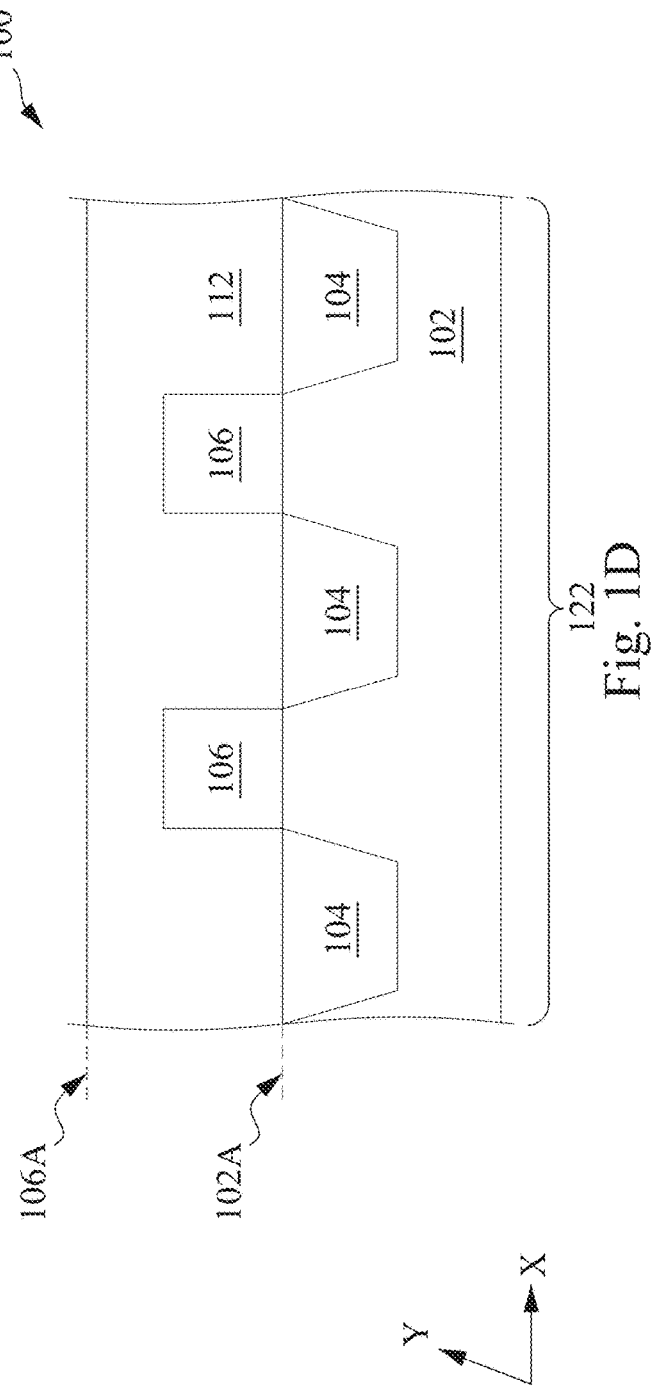

FIG. 1A is a top view of an integrated circuit (IC) structure (or semiconductor structure) 100 and FIGS. 1B, 1C and 1D are sectional views of the IC structure 100 along the dashed lines AA', BB' and CC' of FIG. 1A, respectively constructed according to various aspects of the present disclosure in one embodiment. In some embodiments, the IC structure 100 is formed on flat active regions and includes field-effect transistors (FETs). In some embodiments, the IC structure 100 is formed on fin active regions and includes fin field-effect transistors (FinFETs). In some embodiments, the IC structure 100 includes FETs formed on vertically stacked channels (also referred to as gate-all-around transistors). With the IC structure 100 as an example for illustration, an IC structure and a method making the same are collectively described.

In various embodiments, the IC structure 100 includes various circuit modules integrated on a same substrate. Those circuit modules (or simply circuits) may have different functions or different circuit characteristics. Those circuit modules are placed on different circuit regions of the substrate, either adjacent or distanced, or with different surrounding environments. For example, the IC structure 100 includes a first circuit region 120 and a second circuit region 122 disposed on a substrate 102. The IC structure 100 may include additional circuit regions, similar to or different from the first and second circuit regions. For example, the IC structure 100 includes other logic circuit region(s), other RF circuit region(s), other circuit regions, such as memory regions, imaging sensor regions, analog circuit regions, or a combination thereof. In some embodiments, the first circuit formed in the first circuit region 120 is a logic circuit and the second circuit formed in the second circuit region 122 is a radio frequency (RF) circuit. An RF circuit usually requires high-frequency and high speed, and accordingly less parasitic capacitance. In some embodiments, the IC structure further includes a third circuit formed in a third circuit region, in which the third circuit is a memory circuit including various memory devices, such as static random-access memory (SRAM) cells, configured in an array.

Those circuit regions may include one or more standard cell placed to the IC layout by predefined rules. Those standard cells are repeatedly used in integrated circuit designs and therefore predesigned according to manufacturing technologies and saved in a standard cell library. IC designers could retrieve those standard cells, incorporate in their IC designs, and place into the IC layout according to the predefined placing rules. For examples, a logic standard cell may include various basic circuit devices, such as inverter, AND, NAND, OR, XOR, and NOR, flip-flop circuit, latch or a combination thereof, which are popular in digital circuit design for applications, such as central processing unit (CPU), graphic processing unit (GPU), and system on chip (SOC) chip designs.

The IC structure 100 includes a semiconductor substrate 102. The semiconductor substrate 102 includes silicon. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features 104, such as isolation features formed on the substrate 102 and thereby defining various active regions 106 on the substrate 102. The isolation features 104 utilize isolation technology, such as shallow trench isolation (STI), to define and electrically isolate the various active regions. Each active region 106 is surrounded by a continuous isolation feature such that it is separated from other adjacent active regions. The isolation features 104 include silicon oxide, silicon nitride, silicon oxynitride, other suitable dielectric materials, or combinations thereof. The isolation features 104 are formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active region 106 is a region with a semiconductor surface wherein various doped features are formed and configured to one or more device, such as a diode, a transistor, and/or other suitable devices. The active region may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth, for performance enhancement, such as strain effect to increase carrier mobility.

In some embodiments, the active region 106 is three-dimensional, such as a fin active region extended above the isolation feature. The fin active region 106 is extruded above the isolation features 104 from the substrate 102 and has a three-dimensional profile for more effective coupling between the channel and the gate electrode of a FET. Particularly, the substrate 102 has a top surface and the fin active region 106 has a top surface 106A that is above the top surface of the substrate 102. The fin active region 106 may be formed by selective etching to recess the isolation features, or selective epitaxial growth to grow active regions with a semiconductor same or different from that of the substrate 102, or a combination thereof.

The semiconductor substrate 102 further includes various doped features, such as n-type doped wells, p-type doped wells, source and drain features, other doped features, or a combination thereof configured to form various devices or components of the devices, such as source and drain features of a field-effect transistor. In the present example illustrated in FIG. 1A, the IC structure 100 includes a negatively doped well (also referred to as N well) 108 and a positively doped well (also referred to as P well) 110. The N well 108 includes negative dopant, such as phosphorus. And the P well 110 includes positive dopant, such as boron. The N well 108 and the P well 110 are formed by suitable technologies, such as ion implantation, diffusion or a combination thereof. In the present embodiment, one active region 106 is formed in the N well 108 and another active region 106 is formed in the P well 110.

FIG. 1C further illustrates the isolation features 104 and an interlevel dielectric (ILD) layer 140 in a sectional view. Especially, the top surface of the substrate 102 is defined as a surface leveling to the top surface of the isolation features 104 and is referred to as 102A while the top surface of the fin active regions 106 is referred to as 106A.

Various IC devices formed on the semiconductor substrate 102. The IC devices includes fin field-effect transistors (FinFETs) and may further include diodes, bipolar transistors, imaging sensors, resistors, capacitors, inductors, memory cells, or a combination thereof. In FIG. 1A, exemplary FETs are provided only for illustration.

The IC structure 100 further includes various gates (or gate stacks) 112 having elongated shape oriented in a first direction (X direction). In the present embodiment, X and Y directions are orthogonal and define a top surface of the semiconductor substrate 102. A gate stack includes a gate dielectric layer and a gate electrode. The gate stack is a feature of a FET and functions with other features, such as source/drain (S/D) features and a channel, wherein the channel is a portion of the active region directly underlying the gate stack; and the S/D features are in the active region and are disposed on two sides of the gate stack. In the present embodiments, the gate stacks in the first circuit region 120 and the second circuit region 122 are referred to as gate stacks (or simply gates) 112A and 112B, respectively. It is noted that a gate stack (or a gate) should not be confused with a logic gate, such as NOR logic gate.

The IC structure 100 may also include some dummy gate stacks disposed on the semiconductor substrate 102. A dummy gate is not a gate and does not function as a gate. Instead, the dummy gate is disposed for other purpose, such as tuning the pattern density and/isolation. The dummy gate may have a similar structure as a functional gate 112. Alternatively, the dummy gate may have different structure or even be dielectric feature (also referred to as dielectric gate) that includes one or more dielectric material and function as an isolation feature, in some instances.

The dummy gates are similar to the gates 112 in term of formation. In some embodiments, the gates 112 and the dummy gates are collectively formed by a procedure, such as a gate-last process. In furtherance of the embodiments, initial dummy gates are first formed by deposition and patterning, in which the patterning further includes lithography process and etching. Afterward, a subset of the initial dummy gates is replaced to form gates 112 by depositing a gate dielectric layer and a gate electrode while the rest of the initial dummy gates are replaced to form dielectric gates by depositing dielectric material(s). Furthermore, the dummy gate is disposed and configured differently and therefore functions differently. In the depicted embodiment, some dielectric gates are placed on the border regions between circuit modules or borders of the standard cells to function as isolation to separate one standard cell to an adjacent standard cell, and some dielectric gates are placed inside the standard cells or inside a circuit module in a circuit region for one or more considerations, such as isolation between the adjacent FETs and adjust pattern density. Thus, the dummy gates provide isolation function between adjacent IC devices and additionally provides pattern density adjustment for improved fabrication, such as etching, deposition and CMP.

In the present embodiment, the IC structure 100 includes a first circuit region 120 for logic circuit and a second circuit region 122 for an RF circuit. The two circuit regions 120 and 122 may be placed next to each other or distance away separated by a dummy region that includes a plurality of dummy gates.

In the depicted embodiment, the IC structure 100 includes the first active region 106 in the N well 108 and the second active region 106 in the P well 110. The gate 112A in the first circuit region 120 may extend continuously from the first active region 106 (in the N well 108) to the second active region 106 (in the P well 110) along the X direction. Similarly, the gate 112B in the second circuit region 122 may extend continuously from the first active region 106 (in the N well 108) to the second active region 106 (in the P well 110) along the X direction.

With a source 126, drain 128, and channel 130 formed for each transistor associated with a respective gate, a respective active region and a respective circuit region, the first circuit region 120 includes one p-type FET (pFET) 132 in the N well 108 and one n-type FET (nFET) 134 in the P well 110; and the second circuit region 122 includes one pFET 136 in the N well 108 and one nFET 138 in the P well 110. In the present embodiment, the pFET 132, the nFET 134, and other FETs in the first circuit region 120 are integrated to form a functional circuit block, such as a logic circuit; and the pFET 136, the nFET 138, and other FETs in the second circuit region 122 are integrated to form another functional circuit block, such as an RF circuit.

FIGS. 1A through 1D only provide an exemplary IC structure 100 having the first circuit region 120 and the second circuit region 122 for illustration. However, it is understood that the IC structure 100 may include additional circuit regions and some dummy regions (or filler regions) added in a various configuration. In some embodiments, various circuit regions are surrounded by respective dummy regions. For examples, depending on individual design, additional circuit regions and dummy regions may be added to the left edge, to the right edge, to the up edge, and/or to the down edge of FIG. 1A in a similar configuration. The IC structures in other figures, such as those discussed below, should be understood similarly. As illustrated in FIG. 1B, two or more circuit regions are configured in a cascade mode.

Especially, the gates 112A in the first circuit region 120 and the gates 112B in the second circuit region 122 have different pitches. A pitch is defined as periodic distance of an array of gates, such as a center to center distance of two adjacent gates in the array of gates. In the present embodiment, the gates 112A has a first pitch P1 and the gates 112B has a second pitch P2 being greater than the first pitch P1. For example, the first pitch P1 is less than a reference pitch and the second pitch P2 is greater than the reference pitch. The reference pitch is determined according to fabrication technology and characteristics of the first and second transistors. In the depicted embodiment, the reference pitch is 100 nm. For example, the first pitch P1 is less than 100 nm and the second pitch P2 is greater than 100 nm. In some embodiments, the ratio P2/P1 is greater enough, such as greater than 1.5, to achieve the expected circuit performance enhancement with respective gate profiles, which will be further described in detail later. In some embodiments, the ratio P2/P1 ranges between 1.2 and 2. the first pitch P1 and the second pitch P2 can be respectively tuned for respective circuit performance. Thus, the RF circuit in the second circuit region 122 can have a greater pitch, less parasitic capacitance and high frequency performance while the logic circuit in the first circuit region 120 can have a less pitch and higher packing density without degrading the overall circuit performance.

Additionally, the gates 112A and 112B may be different in gate pitch, gate dimensions, gate structure, gate profile, gate orientation, gate configuration, gate composition, gate environment, dummy gate design, or a combination thereof. The IC structure 100 may have a three-dimensional structure to have enhanced gate coupling and improved circuit performance. In some embodiments, the IC structure 100 includes fin active regions with active regions extruded above the substrate 102, such as extruded above the top surface of the isolation features 104. In some embodiments, the IC structure 100 includes vertically-stacked multiple channels, such as gate-all-around (GAA) structure. In some embodiments, the IC structure 100 includes a third circuit region, a fourth circuit region, and so on with different gate pitches for different circuits, such as memory cells, input/output (I/O) devices and so on.

In the above example, only two circuit regions (120 and 122) are illustrated. However, the IC structure 100 may include multiple circuit regions, each being designed for respective functions, such as a first circuit region for a logic circuit with a first gate pitch, a second circuit region for a RF circuit with a second gate pitch, a third circuit region for a memory circuit with a third gate pitch, a fourth circuit region for I/O devices with a fourth gate pitch, and etc. Those gate pitches are different from each other and individually tuned for respective circuit characteristics and performance enhancement. Furthermore, each circuit regions includes dummy gates surrounding the functional gates. The dummy gates are further tuned with different design (such as gate pitch, gate dimensions and gate groups) to compensate the pattern density such that the process defects are eliminated while the circuit performance is enhanced. The areas for the dummy gates are referred to as dummy areas and the areas for the functional gates are referred to as active device areas (or active circuit areas). Since the dummy gates in the dummy areas are not parts of the circuits and are designed to enhance the fabrication and circuit performance, and therefore have more freedoms for tuning, such as gate materials, gate pitches, gate dimensions, gate orientations and gate pattern density. Furthermore, placements and sizes of the dummy areas are also factors to be used for tuning process. For examples, a dummy area is to be placed next to an edge of a circuit region where the gate pattern density is relatively away from the average.

Figure 1E:
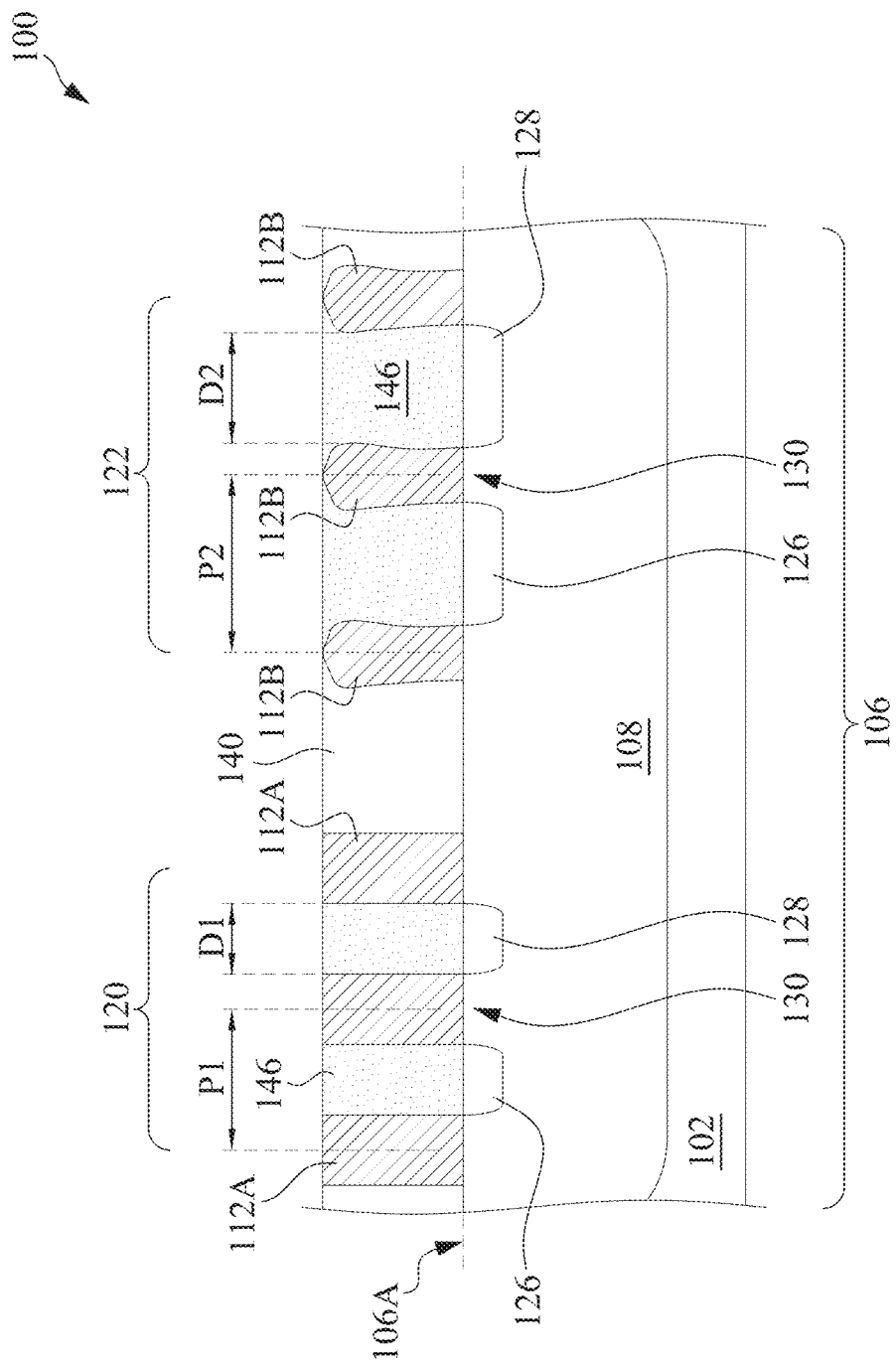

FIG. 1E is a sectional view of the IC structure 100 along the dashed line AA' of FIG. 1A constructed according to various aspects of the present disclosure in one embodiment. FIG. 1E is similar to FIG. 1B but with contacts 146 additionally illustrated. The contacts 146 are configured to land on respective sources 126 and drains 128. Due to the different gate pitches and additional different gate dimensions, the contacts 146 to the sources 126 and the drains 128 in the first circuit region 120 and the second circuit region 122 have different dimensions. For example, the contacts 146 to sources 126 and drains 128 for the logic circuit in the first circuit region 120 have a first dimension D1 less than a reference dimension (such as 45 nm in some examples), and the contacts 146 to sources 126 and drains 128 for the RF circuit in the second circuit region 122 have a second dimension D2 greater than a reference dimension. In some embodiments, the ratio D2/D1 is greater 2. In some embodiments, the ratio D2/D1 ranges between 1.5 and 3. The contacts 146 are formed by any suitable procedure. In some embodiments, the contacts 146 are formed by a procedure that includes lithography process and etching to form contact holes in the ILD layer 140; deposition to fill the contact holes with one or more conductive materials (such as tungsten, nickel, cobalt, ruthenium, other suitable conductive material or a combination thereof); and a CMP process to remove the excessive conductive materials. In the depicted embodiment, the contacts 146 are made self-aligned with the gaps between the gates 112.

Figure 2A:
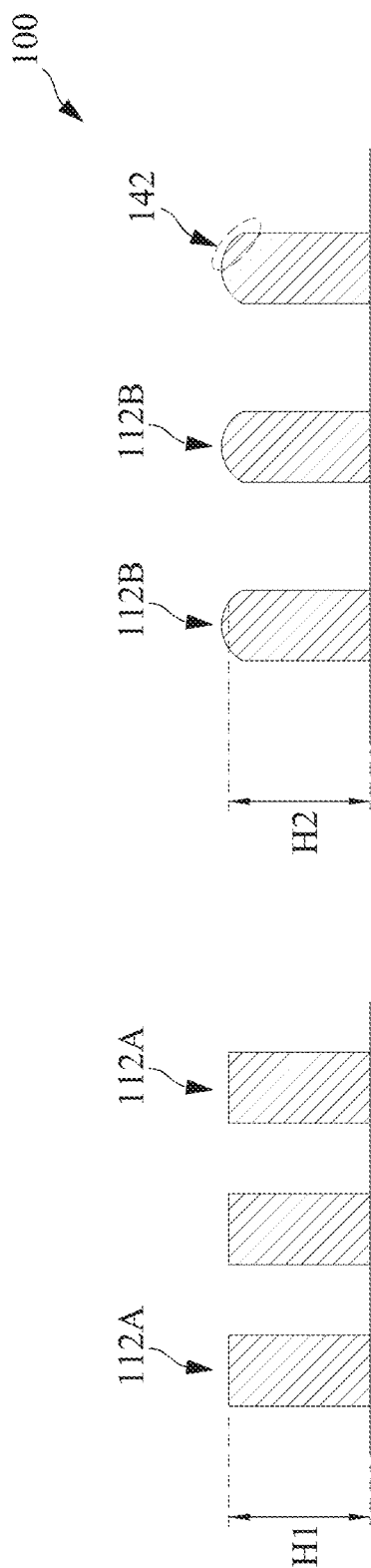
FIGS. 2A and 2B are sectional views of the IC structure, in portion, constructed according to various aspects of the present disclosure in one embodiment.
Figure 2B:
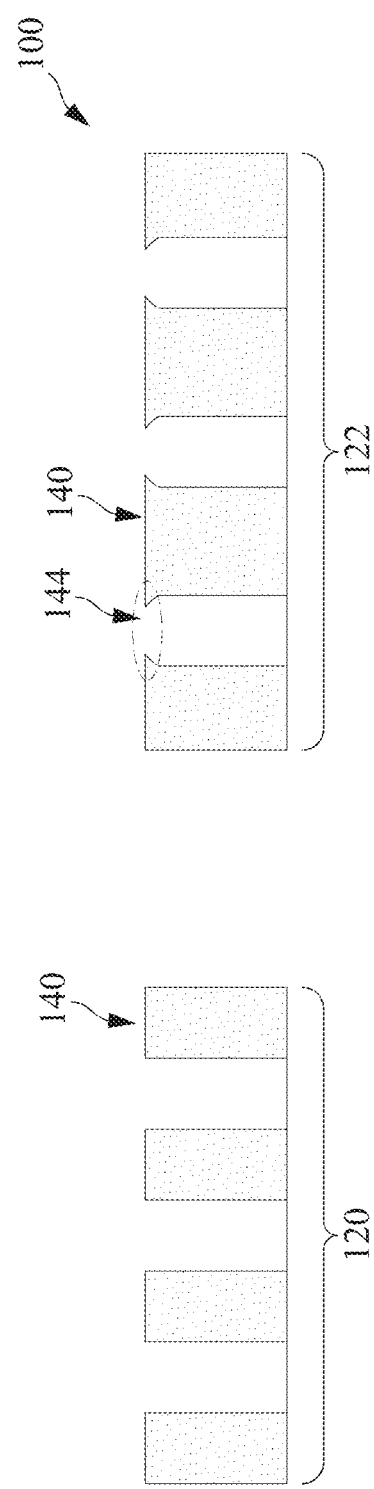

FIGS. 2A and 2B are sectional views of an IC structure 100, in portion constructed according to some embodiments. FIG. 2A only illustrates gates (or gate stacks) 112A and 112B in the first and second circuit regions 120 and 122, respectively. FIG. 2B only illustrates the ILD layer 140 for better understanding. The gates 112 (112A and 112B) are formed by deposition and patterning. For example, the gate materials are deposited on the substrate 102 and are patterned to form gate stacks by lithography process and etching. In some embodiments, initial dummy gates, such as polysilicon gates, are formed by deposition and patterning. Then the initial dummy gates are replaced by with gates 112 having metal and high-k dielectric material during a process, such as a gate-last process. The gate-last process may further include etching to remove the initial dummy gates, which results in gate trenches; filling gate materials (such as high-k dielectric material and metal) in the gate trenches; and performing a CMP process.

The gates 112A and 112B are designed and formed to have different pitches, as described above. In the depicted embodiment, the first pitch P1 of the gate stacks 112A in the first circuit region 120 is less than the second pitch P2 of the gate stacks 112B in the second circuit region 122. In the depicted embodiment, the gates 112A and 112B have a constant gate width along the Y direction. Due to different gate pitches in the first circuit region 120 and the second circuit region 122, the etch loading effect causes more etching impact to the gate materials in the second circuit region 122 and leads to different gate profiles in those two circuit regions. Especially, gates 112A has a first height H1 and gates 112B has a second height H2 less than H1, such as the gate height ratio H1/H2 being greater than 1.1. In some embodiments, the gate height ratio H1/H2 ranges between 1.1 and 1.5. Furthermore, the etch loading effect causes the gate stacks 112B in the second circuit region 122 with rounding corner 142, as illustrated in FIG. 2A. In return, this also causes the ILD layer 140 in the second circuit region 122 with necking profile 144, as illustrated in FIG. 2B. The ILD layer 140 is formed in the gaps between the adjacent gates 112 by deposition and additionally polishing (such as CMP), the profile of the ILD layer 140 is complimentary to the profile of the gates 112. The necking profile 144 is associated with rounding corner 142.

Our experiment data show that the characteristics and performance of the IC structure 100 are improved and enhanced by utilizing the disclosed structure and the method making the same. The experiments confirm that the transition frequency ("fT") can be effectively improved by increasing gate pitch. This is because the increased gate pitch can reduce the parasitic capacitance. However, when the gate pitch is further increased, the contribution to the parasitic capacitance is dominated by the dielectric constant of the insulating material, such as the ILD layer 140 between the gaps of the adjacent gates 112. Thus, at a certain point, further increasement to the gate pitch will increase the parasitic capacitance among the competing factors of the dielectric constant and the gate pitch. This point is referred to as fT peak. The gate pitch of the RF circuit is increased such that it is close to fT peak for optimized performance of the RF circuit. Overall, the RF circuit performance is improved when the gate pitch is increased, especially when it reaches to fT peak. Therefore, the present disclosure provides an IC structure having logic and RF circuits with different gate pitches and a method making the same, especially the second gate pitch associated with the fT peak.

Figure 3:
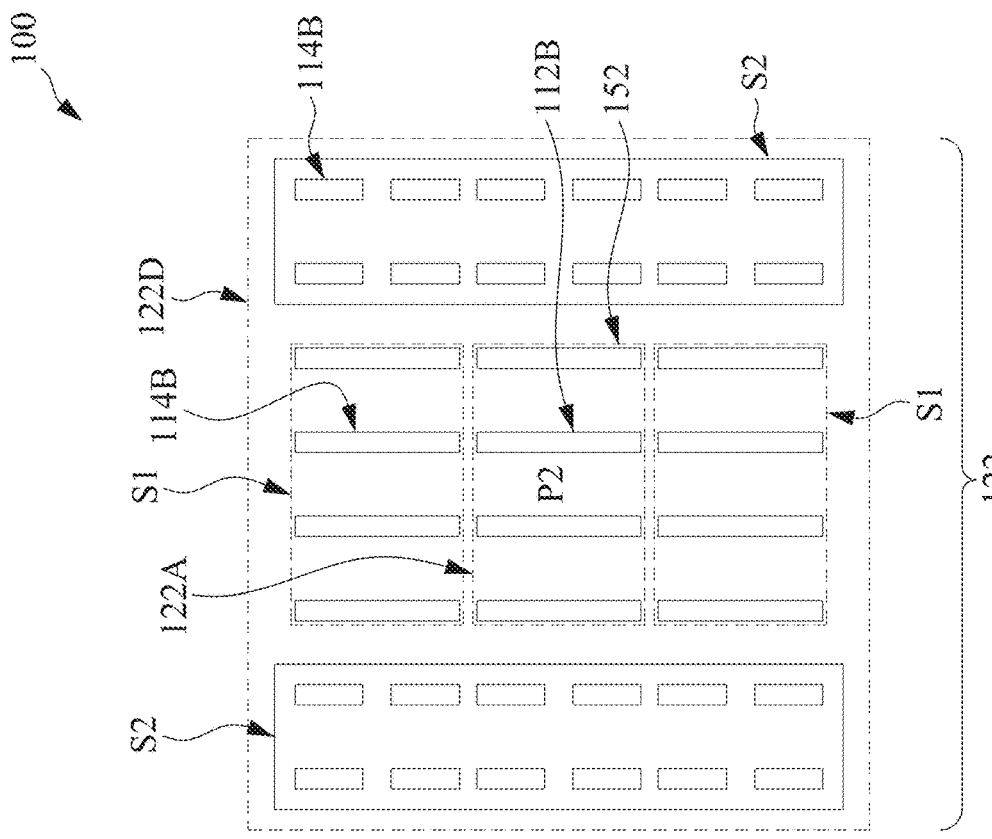
FIGS. 3, 4A and 4B are top views of an IC structure constructed according to various embodiments.
Figure 3:
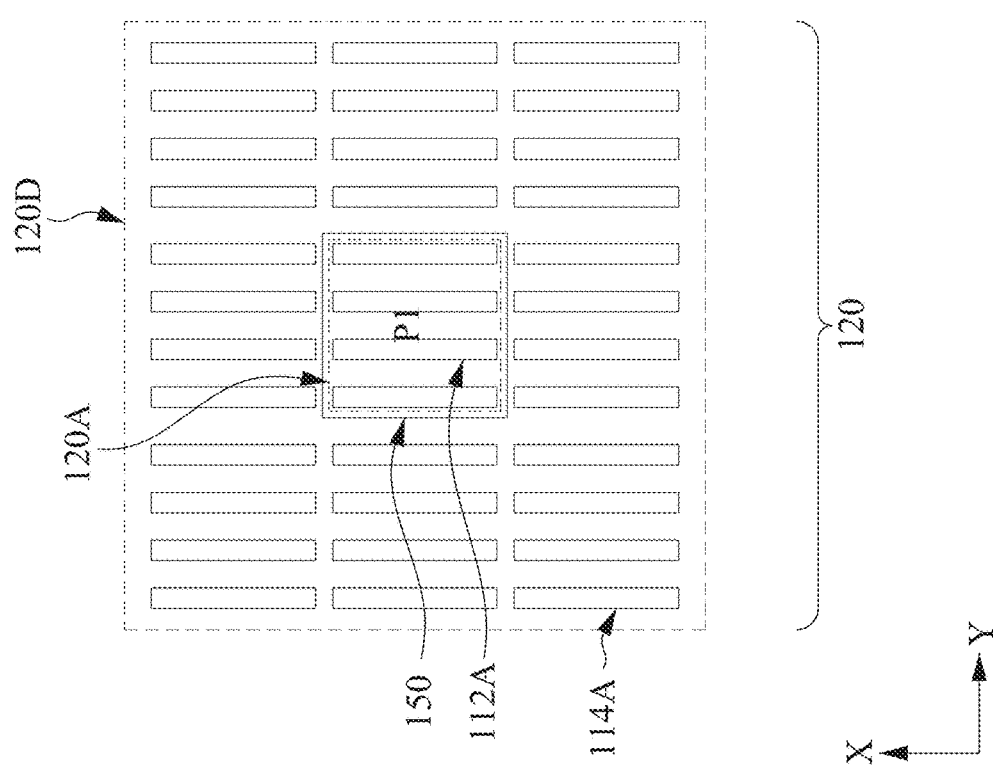

FIG. 3 is a top view of the IC structure 100 constructed in accordance with some embodiments. The IC structure 100 includes the first circuit region 120 for a logic circuit and the second circuit region 122 for a RF circuit. The IC structure 100 in FIG. 3 has a gate layout optimized for enhanced circuit performance to both logic circuit in the first circuit region 120 and RF circuit in the second circuit region 122. The first circuit region 120 includes an active device area 120A having FETs and corresponding first gates 112A with the first pitch P1, and the second circuit region 122 includes an active device area 122A having FETs and corresponding second gates 112B with the second pitch P2, wherein P2 is greater than P1. For example, P1<100 nm and P2>100 nm. Particularly, the first circuit region 120 further includes a dummy area 120D having various dummy gates 114A surrounding the functional gates 112A in the active device area 120A, and the second circuit region 122 includes a dummy area 122D having various dummy gates 114B surrounding the functional gates 112B in the active device area 122A. As described above, the dummy gates in the dummy areas provide more freedom to tune the circuit performance and fabrication window. For example, when the gate pitch of the second gates 112B is increased, such as increased to near fT peak, the parasitic capacitance is decreased and the device high frequency performance for the RF circuit is improved. However, the increased gate pitch causes the gate density decreased, resulting in more process deficiency or defects (such as CMP variation over different pattern density). Accordingly, the gate pitch for dummy gates 114B in the dummy area 122D surrounding the functional gates 112B in the active device area 122A is tuned to compensate the variation of the gate pattern density in the second circuit region 122 for fabrication improvement. For example, the gate pitch of the dummy gates 114B is designed to be less than P2, such that the average gate pattern density in the second circuit region 122 is increased or is substantially same or similar to that in the first circuit region 120. For the logic circuit, the high-frequency parasitic capacitance effect is not a concern, the corresponding dummy gates 114A are designed to maintain the same gate pitch P1 as that of the functional gate stacks 112A.

In the depicted embodiment, the dummy gates 114A have shape, size pitch, orientation and configuration similar to those of the functional gates 112A while the dummy gates 114B have shape, size pitch, orientation and configuration different from those of the functional gates 112B. Even more, the dummy gates 114B have different subsets respectively tuned to provide more tuning freedom and more tuning effect. For example, the dummy gates 114B includes a first subset S1 and a second subset S2. The dummy gates 114B in the first subset S1 have similar shape, size pitch, orientation and configuration to the functional gates 112B while the dummy gates 114B in the second subset S2 have shape, size pitch, orientation, configuration or a combination thereof different from those of the functional gates 112B. In the depicted embodiment, the dummy gates 114B in the second subset S2 are designed to have different length along X direction, different pitch along the Y direction, or both different length and different pitch. In furtherance of the embodiment, the dummy gate stacks 114B in the second subset S2 are designed with reduced gate pitch (<P2) to increase the pattern density so that collectively the average pattern density of the dummy gates 114B and the functional gates 112B in the second circuit region 122 is increased or is close to that of the first circuit region 120. In some embodiments illustrated in FIG. 3, the dummy gates 114B in the second subset S2 are designed to have shorter length along X direction and less pitch along the Y direction than those of the functional gates 122A, respectively.

In some embodiments, the IC structure 100 further includes guard rings disposed and configured to bias the substrate in order to shield interference, reduce noise and enhance circuit performance. A guard ring may be a conductive feature, such as a metal line, configured to connect to the substrate through a contact feature. The guard ring is further connected to a power line, such as a grounding line to bias the substrate. In some embodiments, a guard ring 152 is displaced between the active device area 122A and the dummy area 122D, particularly, between the functional gates 112B of the active device area 122A and the dummy gates 114B of the dummy area 122D. In another embodiment, another guard ring 150 may be displaced between the functional gates 112A of the active device area 120A and the dummy gates 114A of the dummy region 120D.

In some embodiments, some dummy gates 114B are configured to be biased or connected to bias the substrate 102, such as through underlying doped wells (an N-well, a P-well or both) to function as guard ring. In furtherance of the embodiments, the dummy gates 114B of the dummy area 122D are configured to be biased or connected to bias the substrate 102 while the dummy gates 114A of the dummy area 120D are not biased (such as floating). In a depicted embodiment, the dummy gates 114B of the dummy area 122D are free of gate dielectric layer and connected to power line (such as grounding line) to bias the substrate 102 while the dummy gates 114A of the dummy area 120D include a gate dielectric layer and are not connected to power line, such as floating.

Figure 4A:
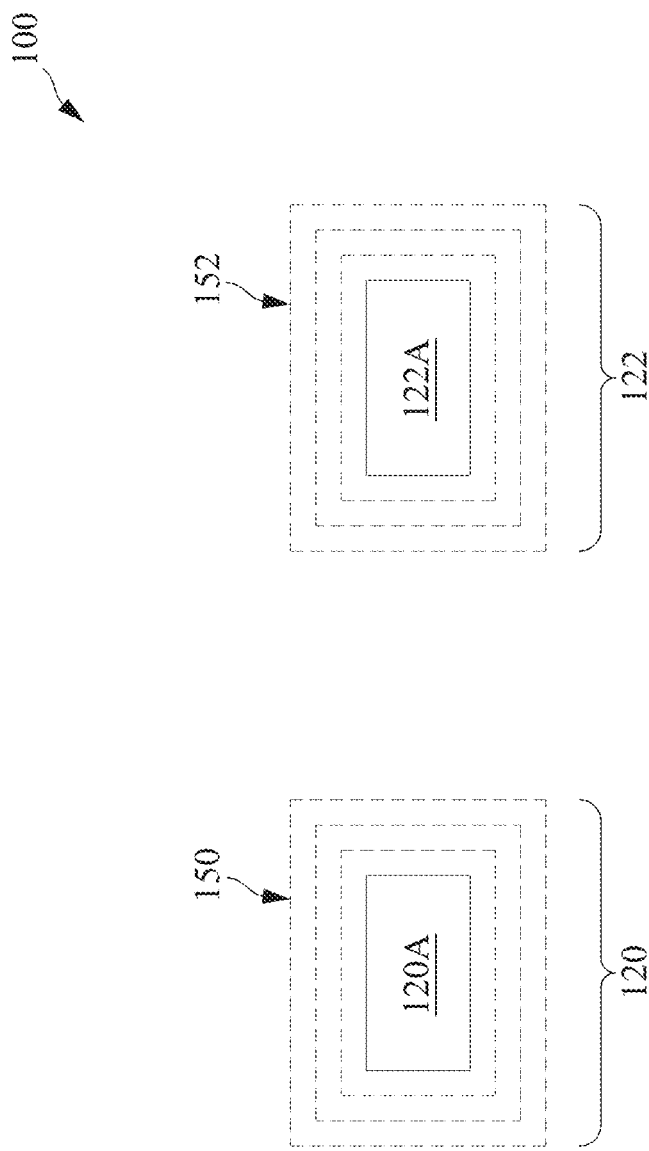

FIG. 4A is a top view of the IC structure 100, in portion (especially guard rings), constructed in accordance with some embodiments. In the depicted embodiments, the gates are designed to function as guard rings. Particularly, those gates are configured to surround the active device areas and are oriented to be in parallel with the adjacent edges of the respective active device areas. The guard rings may include multiple layers to enhance the protection effect, such as three layers in the example illustrated in FIG. 4A. The multiple layers of the guard rings may be further designed with different spacings for protection effect and circuit area consideration. In some embodiments, the guard rings may have graded spacings. For example, a first spacing between the inner guard ring and the middle guard ring is C1, and a second spacing between the middle guard ring and the outer guard ring is C2. C2 is greater than C1. The ratio C2/C1 is greater than 1.5 in some examples. In the depicted embodiment, the guard rings 152 in the second circuit region 122 are configured to be connected to a bias power line, such as grounding, while the guard rings 150 in the first circuit region 120 are configured to be floating, which is similar to the dummy gates 114 in the dummy areas. Especially, the guard rings are not only oriented in one direction, such as X direction, but include portions oriented in X direction and portions oriented in Y direction such that being configured to enclose the circuit region (such as 122A). Alternatively, the guard rings 152 are configured around the RF circuit in the active circuit area 122A while the guard rings 150 are absent.

Figure 4B:
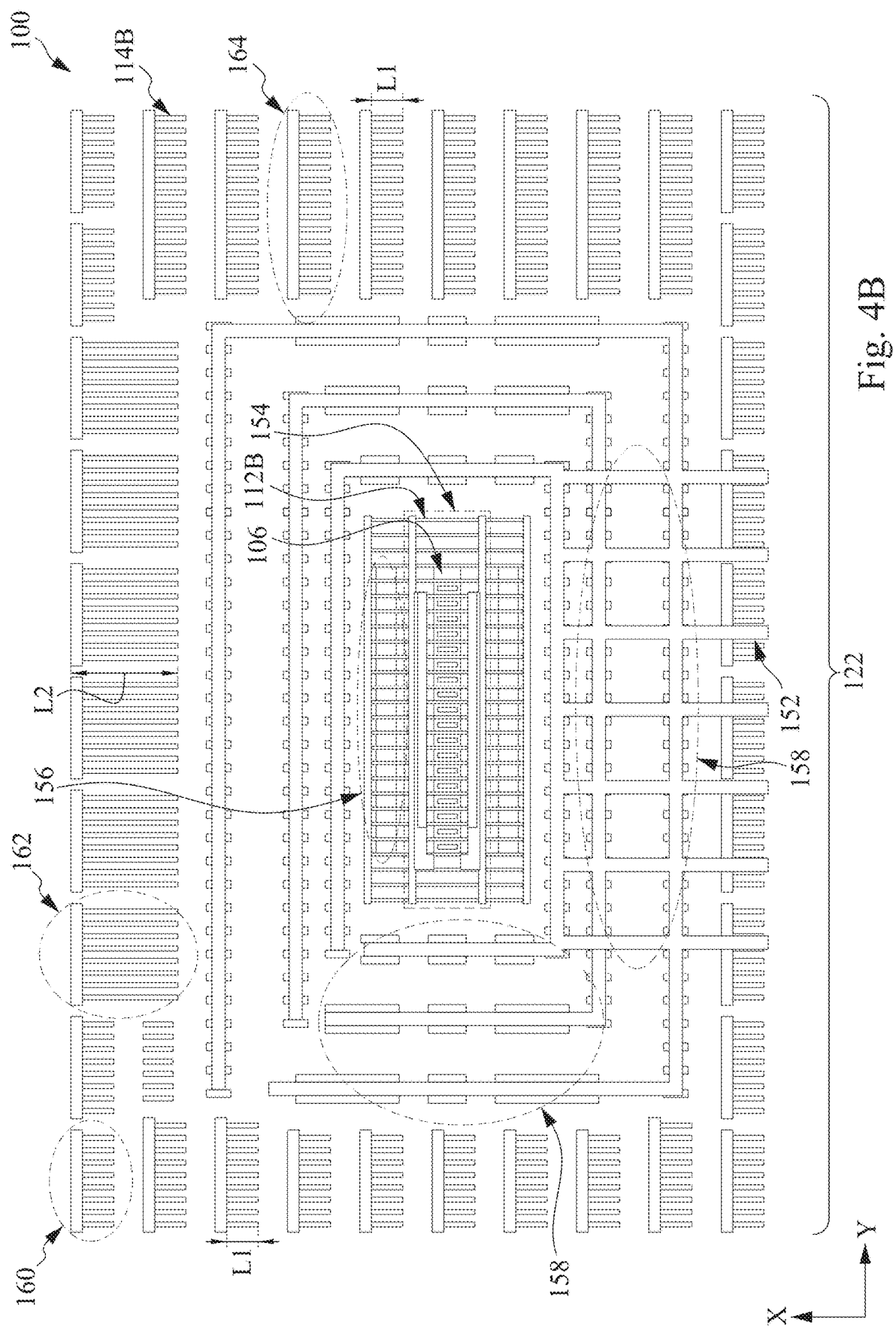

FIG. 4B is a top view of the IC structure 100 constructed, in portion, in accordance with some embodiments. The IC 100 has a gate layout optimized for enhanced circuit performance to both logic circuit in the first circuit region 120 and RF circuit in the second circuit region 122 (only the second circuit region 122 is shown in FIG. 4B). The IC structure 100 includes fin active regions 106 and gates (such as functional gates 112B and dummy gates 114B) oriented in the Y and X directions, respectively. The second circuit region 122 includes an active device area 122A for an RF circuit 154 and a dummy area 122D surrounding the active device area 122A. Especially, the IC structure 100 includes various blocks with different gate configurations. In the depicted embodiments, the RF circuit 154 includes functional gates 112B configured in an array and surrounded by dummy gates 114B in the dummy region. The RF circuit 154 further includes fin active regions 106, sources, drains, contacts, vias and metal lines configured to form various transistors. Especially, the functional gates 112B of the RF circuit 154 have an increased gate pitch (greater than that of the logic circuit) for enhanced high-frequency performance of the RF circuit 154. The dummy gates 114B are designed to have gate pitches different from that of the functional gates 112B to compensate the pattern density and reduce the process defects. More particularly, the dummy gates 114B are configured differently (different in gate pitch, gate dimensions, gate orientations, gate grouping, or a combination thereof) in different blocks (or sub-dummy-regions) to have more freedom to tune pattern density and eliminate (or reduce) the process defects. In the depicted embodiment, the dummy gates 114B surrounding the functional gates 112B include various subsets of dummy gates 114B in respective sub-dummy-regions 156, 158, 160, 162 and 164.

The first subset of dummy gates 114B in the first sub-dummy-region 156 are disposed on two sides (spaced along the X direction) of the functional gates 112B with a gate pitch similar to that of the functional gates 112B; the second subset of dummy gates 114B in the second sub-dummy-region 158 are disposed on two sides (spaced along the Y direction) of the functional gates 112B with a gate pitch and a gate dimension different from (e.g., greater than) those of the functional gates 112B; the third subset of dummy gates 114B in the third sub-dummy-region 160 are disposed on the outmost of the RF circuit region 154 of the functional gates 112B with a gate pitch less than that of the functional gates 112B; the fourth subset of dummy gates 114B in the fourth sub-dummy-region 162 are disposed on the outmost of the RF circuit region 154 and configured on two edges (spaced along the X direction) of the functional gates 112B with a gate pitch less than that of the functional gates 112B (or same as the gate pitch of the dummy gates 114B in the third sub-dummy-region 160); and the fifth subset of dummy gates 114B in the fifth sub-dummy-region 164 are disposed on the outmost of the RF circuit 154 of the functional gates 112B with a gate pitch less than that of the functional gates 112B (or same as the gate pitch of the dummy gates 114B in the third sub-dummy-region 160).

Particularly, the third subset of dummy gates 114B in the third sub-dummy-region 160 are grouped into an array with each row having a first number N1 of dummy gates 114B; and the fifth subset dummy gates in the fifth sub-dummy-region 164 are grouped into an array with each row having a second number N2 of dummy gates 114B, in which N2 is greater than N1. For example, N1=8 and N2=15. The dummy gates 114B in the third sub-dummy-region 160 and the fifth sub-dummy-region 164 have a first gate length L1 while the dummy gates 114B in the fourth sub-region 162 have a second gate length L2 being greater than L1. All functional gates 112B and dummy gates 114B are oriented in the X direction. By tuning the dummy gates 114B in terms of gate pitch, gate dimensions, and distribution of the dummy gates in various sub-regions. The pattern density is improved, and the process defects are eliminated or reduced while the RF circuit performance is enhanced.

The IC structure 100 also includes guard rings 152 configured around the active device area 122A and connected to bias the substrate, such as to grounding. The guard rings 152 are placed to and connected to shield the noise interference under high frequency operation of the RF circuit 154. The guard rings 152 may have different configuration, such as surrounding the RF circuit 154 with multiple layers (e.g., 3 layers in the depicted example of FIG. 4B). In some examples, the guard ring 152 are metal lines connected to the substrate through the contact features. In some embodiments, the guard rings 152 are configured between the functional gates 112B in the active device area 122A and the dummy gates 114B in the dummy area 122D.

Figure 5:
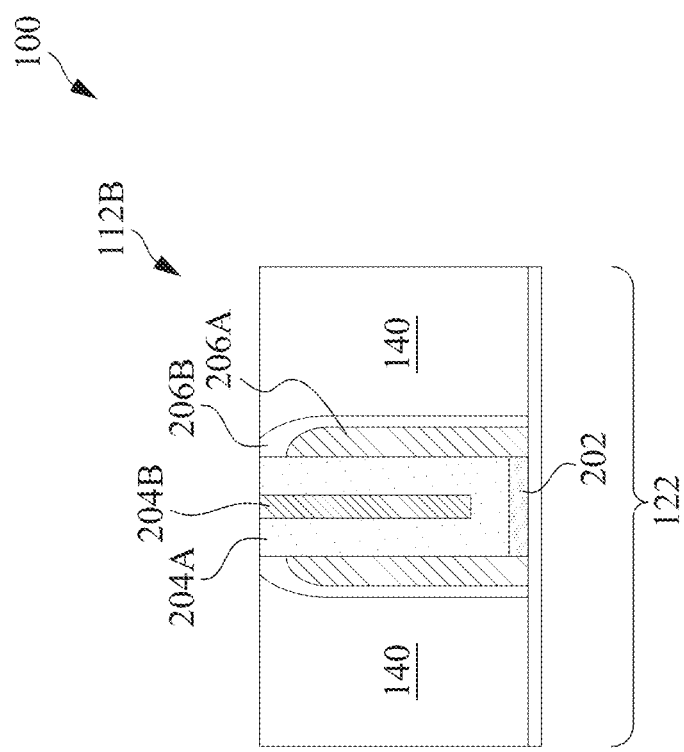
FIGS. 5, 6 and 7 are sectional views of the IC structure constructed according to various embodiments.
Figure 5:
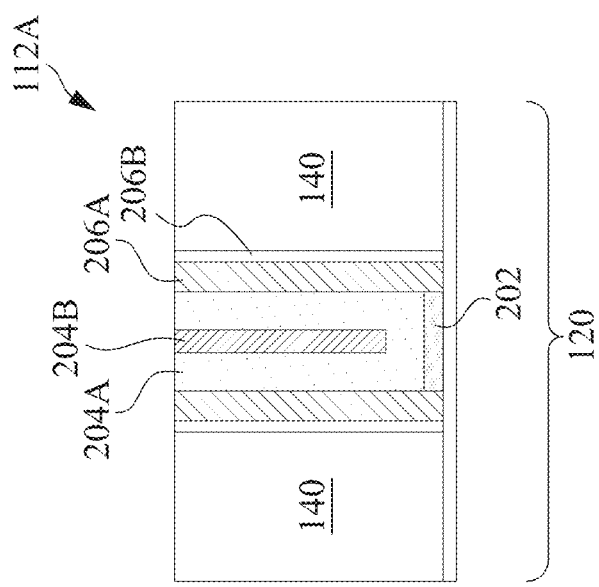

FIG. 5 is a sectional view of the IC structure 100, in portion, constructed in accordance with some embodiments. FIG. 5 is similar to FIG. 2A but with more details. The gate 112 (such as gate 112A or gate 112B) includes a gate dielectric layer 202, gate electrode 204 and gate spacer 206. The gate dielectric layer 202 may further include an interfacial layer and a high-k dielectric material layer. The gate electrode 204 may further include a work function metal 204A and a fill metal 204B. The gate 112 may further include other materials, such as a capping layer between the gate dielectric layer 202 and the gate electrode 204. The gate spacer 206 may include one or more dielectric material, such as silicon oxide, silicon nitride or a combination thereof, disposed on sidewalls of the gate electrode 204. In the depicted embodiment, the gate spacer 206 includes an inner spacer 206A and an outer spacer 206B with different dielectric composition. The gates 112 are embedded in an ILD layer 140.

Figure 7:
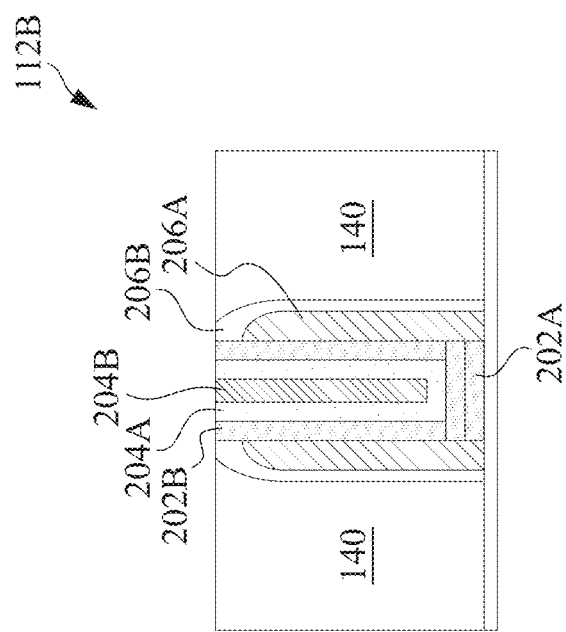

FIG. 7 is similar to FIG. 5 and is constructed according to some embodiments with more details. The gate 112B includes gate dielectric layer 202 disposed on the channel, gate electrode 204 disposed on the gate dielectric layer, and gate spacer 206 disposed on sidewalls of the gate electrode. The gate dielectric layer 202 may include an interfacial layer 202A and a high-k dielectric material layer 202B. In some examples, the gate dielectric layer 202 may include two or more than two oxide layers with different dielectric constants, such as silicon oxide with different oxygen concentration, or silicon oxide/silicon nitride or a combination thereof. In the depicted embodiment, the gate electrode 204 includes a work function metal layer 204A and a fill metal layer 204B. The work function metal layer 204A may include multiple films, in which one film has a higher work function than others, is thicker than other films or both. The work function metal layer 204A may include Ti. Ta, Cr, Ni, Mo, Cu, Zr, Zn, Fe, Sn, or a combination thereof and one film of the work function metal layer 204A may be an oxide or nitride of the above metal(s). The work function metal layer 204A may have a thickness ranging between 10 Angstrom and 40 Angstrom. The fill metal layer 204B may include W, AL, Cu or a combination thereof. The gate spacer 206 may include multiple dielectric layers, such as a silicon oxide layer and a silicon nitride layer. In the depicted embodiment, the gate spacer 206 includes a first silicon nitride layer 206A and a second silicon nitride layer 206B with different composition, different thickness or both. In one example, the first silicon nitride layer 206A has a nitrogen concentration greater than that of the second silicon nitride layer 206B. In another example, the first silicon nitride layer 206A has a thickness greater than that of the second silicon nitride layer 206B. In yet another example, the first silicon nitride layer 206A has a nitrogen concentration and a thickness greater than those of the second silicon nitride layer 206B, respectively. In yet another example, the first silicon nitride layer 206A has a nitrogen concentration and a thickness less than those of the second silicon nitride layer 206B, respectively. The structure, composition and formation of the gate 112 will be further discussed in detail with reference to FIGS. 8, 9 and 10. Especially, the profiles of the gates 112 depend on the compositions and thicknesses of various materials in the gate 112, as detailed above. The gate dielectric layer 202 has the same composition(s) and thickness(es) for the gate 112A for the logic circuit and the gate 112B for the RF circuit.

Figure 6:
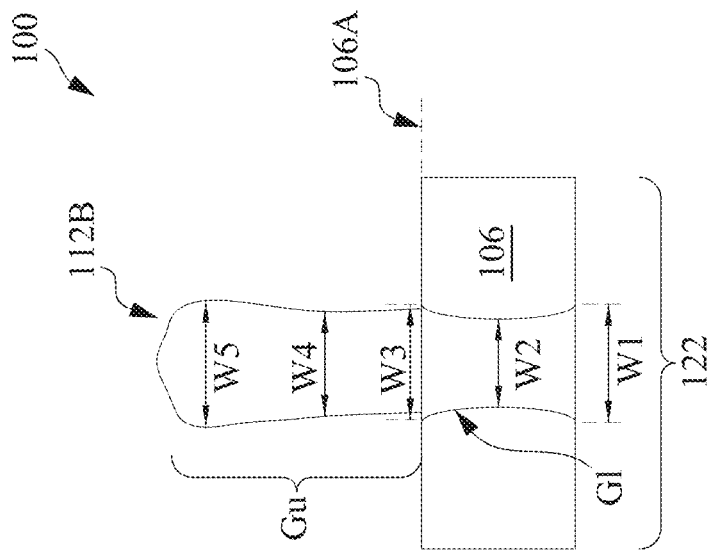
Figure 6:
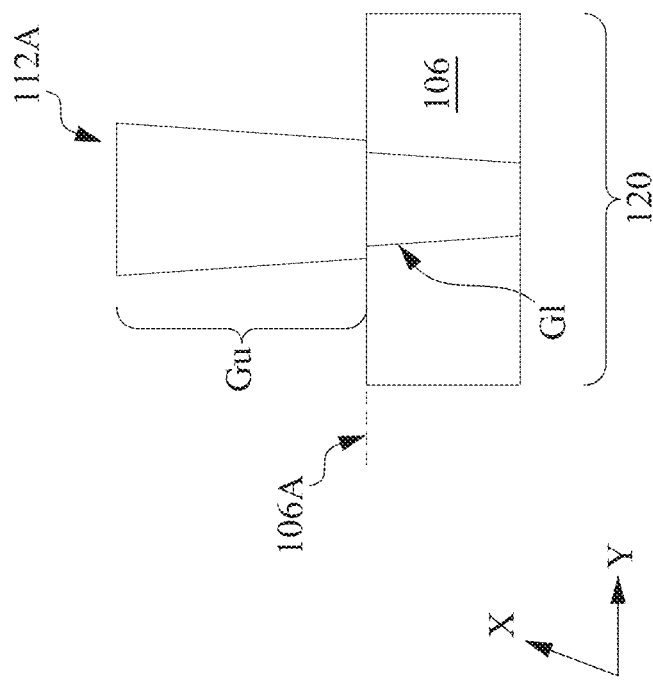

FIG. 6 is a sectional view of the IC structure 100, in portion, constructed in accordance with some embodiments. FIG. 6 provides more details to the profiles of gate 112A and 112B. The first gates 112A include a top portion with a trapezoid shape; and the second gates 112B include a top portion with round corners.

The gate 112 (112A or 112B) includes a lower portion $G_l$ below the top surface 106A of the fin active region 106 and an upper portion $G_u$ above the top surface 106A of the fin active region 106. In the sectional view cut through the fin active region, the lower portion are not visible. However, it is drawn in FIG. 6 to better illustrate the vertical locations and profiles of the gates 112. Only the lower portion is engaged to the channel 130 for capacitive coupling between respective gate 112 (such as 112A or 112B) and channel 130, and therefore is significantly contributed to the gate performance. The lower portions of the gates 112A and 112B have different profiles. Since the functional gate 112B in the RF circuit has a greater gate pitch, the lower portion $G_l$ of the functional gate 112B is subjected to additional etch due to the etch loading effect, further reducing the horizontal dimension of the gate 112B in the lower portion $G_l$. The lower portion of the gate 112B has a minimum dimension (or neck) in the middle. Especially, the lower portion of the gate 112B spans a first dimension W1 at the bottom surface; a second dimension W2 at the middle; and a third dimension W3 at the top (leveling to the top surface 106A of the fin active region 106). Each of W1 and W3 is greater than W2; and W3 is greater than W1. In the depicted example, the ratio W3/W2 ranges between 1.2 and 1.3; and the ratio W1/W2 ranges between 1.05 and 1.13. The upper portion of the functional gate 112B has an uneven profile as well. Especially, the upper portion of the gate 112B spans the third dimension W3 at the bottom surface (leveling with the top surface 106A of the fin active region 106); a fourth dimension W4 at the middle; and a fifth dimension W5 at the top surface. Each of W3 and W5 is greater than W4. In the depicted example, the ratio W5/W4 or W3/W4 ranges between 1.06 and 1.14. This uneven profile of the functional gate 112B further reduce parasitic capacitance to the components (such as FETs) of the RF circuit, thereby achieving improved high-frequency characteristics and performance of the RF circuit.

Figure 9:
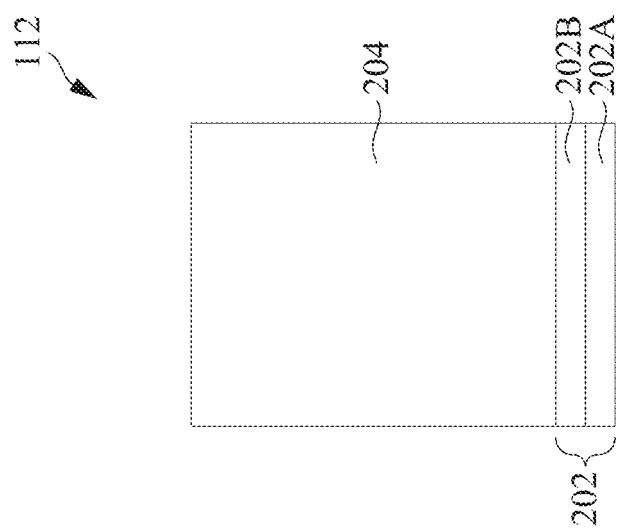
Figure 8:
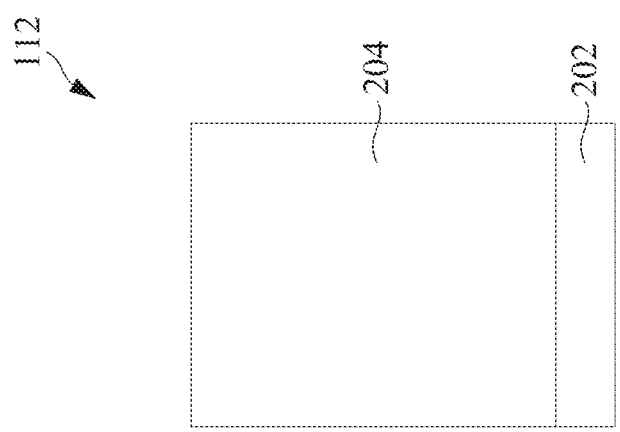

In various embodiments described above, the gates 112 are further described with reference to FIGS. 8-10 in sectional views, according to various embodiments. The gate 112 includes a gate dielectric layer 202 (such as silicon oxide) and a gate electrode 204 (such as doped polysilicon) disposed on the gate dielectric layer, as illustrated in FIG. 8.

In some embodiments, the gate 112 alternatively or additionally includes other proper materials for circuit performance and manufacturing integration. For example, the gate dielectric layer 202 includes an interfacial layer 202A (such as silicon oxide) and a high k dielectric material layer 202B, as illustrated in FIG. 9. The high k dielectric material may include metal oxide, metal nitride or metal oxynitride. In various examples, the high k dielectric material layer includes metal oxide: ZrO2, Al2O3, and HfO2, formed by a suitable method, such as metal organic chemical vapor deposition (MOCVD), physical vapor deposition (PVD), atomic layer deposition (ALD), or molecular beam epitaxy (MBE). In some examples, the interfacial layer includes silicon oxide formed by ALD, thermal oxidation or ultra-violet-Ozone Oxidation. The gate electrode 204 includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). The multiple conductive films are designed for work function matching to n-type FET (nFET) and p-type FET (pFET), respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examples, the work function metal layer for pFET includes titanium nitride, tantalum nitride or a combination thereof.

Figure 10:
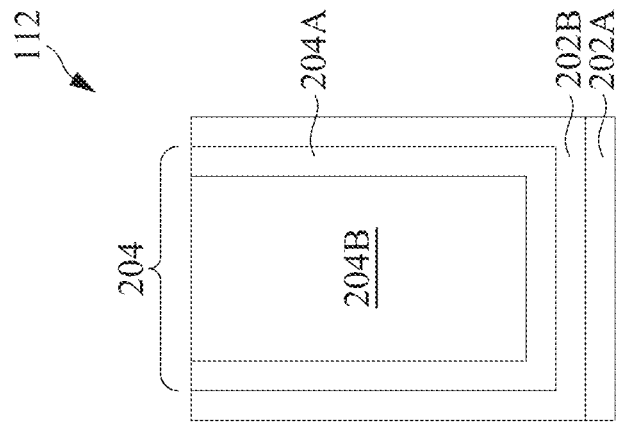
FIGS. 8, 9 and 10 are sectional views of a gate in an IC structure in accordance with some embodiments.

In some embodiments illustrated in FIG. 10, the gate 112 is formed by a different method with a different structure. The gate may be formed by various deposition techniques and a proper procedure, such as gate-last process, wherein a dummy gate is first formed, and then is replaced by a metal gate after the formation the source and drain features. Alternatively, the gate is formed by a high-k-last a process, wherein the both gate dielectric material layer and the gate electrode are replaced by high k dielectric material and metal, respectively, after the formation of the source and drain features. In a high-k-last process, a dummy gate is first formed by deposition and patterning; then source/drain features are formed on gate sides and an inter-layer dielectric layer is formed on the substrate; the dummy gate is removed by etching to result in a gate trench; and then the gate material layers are deposited in the gate trench. In the present example, the gate electrode 204 includes a work function metal layer 204A and a filling metal 204B, such as aluminum or copper. Such formed gate 112 has various gate material layers U-shaped.

In some embodiments, the method for tuning the IC circuit structure is further described below according to some embodiments. The method includes receiving a circuit layout of an IC circuit; and classifying circuit regions according to respective circuit functions, such as logic circuit, RF circuit, memory circuit, I/O circuit and so on. The method further includes modifying the gate pitches of the respective circuits, such as the gate pitch of the RF circuit being increased to improve high frequency performance and the gate pitch of the logic circuit being decreased to increase the circuit packing density. Especially, the gate pitch of the RF circuit is adjusted such that the transition frequency is equal to or close to fT peak. The method further includes modifying the gate width and gate length to further enhance the circuit performances according to circuit characteristics of respective circuits, such as parasitic capacitance of the RF circuit. The method also includes adding a dummy region surrounding a circuit, such as a dummy region surrounding the RF circuit. The shape and size of the dummy area is determined according to one or more factors, such as pattern density, and the shape and size of the RF circuit. The method further includes determining the dummy gates disposed in the dummy area, including the gate pitch, gate width, gate length, gate structure (such as with or without gate dielectric layer), gate composition (such as polysilicon, metal or metal alloy), and gate configuration (such as connected to power line or floating). In some examples, dummy gates include subsets with different grouping, gate pitch, gate length and gate width, such as those illustrated in FIG. 4B. The method also includes adding guard rings surrounding the respective circuit, such as guard rings surrounding the RF circuit. In some examples, the guard rings are disposed between the respective circuit (such as RF circuit) and the surrounding dummy gates in the dummy area. In some embodiments, the guard rings are made of gates but are different from the dummy gates in the dummy area in terms of configuration, composition and orientation. For examples, the guard rings are connected to power lines (such as grounding) while the dummy gates are free of connection and floating. In some examples, the guard rings include portions oriented in X direction and portions oriented in Y direction to be arranged to enclose the respective circuit (such as RF circuit), such as those illustrated in FIG. 4A or 4B.

The present disclosure provides various embodiments of an IC structure having multiple circuit regions with different functions, such as logic circuit and RF circuit. Those circuits may be designed as standard cells configured according to the predefined rules. In various embodiments described above, circuits or standard cells are designed and placed according to the disclosed rules. Each circuit is surrounded by the dummy regions with dummy gates formed thereon. Especially, the functional gates in a RF circuit are designed to have an increased gate pitch for reduced parasitic capacitance and enhanced high-frequency performance. The dummy gates surrounding the RF circuit are designed to have reduced gate pitch to compensate the variation of the pattern density caused by the functional gates of increased gate pitch in the RF circuit, thereby eliminating or reducing the process defects so that the overall IC structure has enhanced circuit performance without degradation of the fabrication quality.

In one example aspect, the present disclosure provides a semiconductor structure in accordance with some embodiment. The semiconductor structure includes a semiconductor substrate having a first circuit region and a second circuit region; active regions extended from the semiconductor substrate and surrounded by isolation features; first transistors that include first gate stacks formed on the active regions and disposed in the first circuit region, the first gate stacks having a first gate pitch less than a reference pitch; and second transistors that include second gate stacks formed on the active regions and disposed in the second circuit region, the second gate stacks having a second pitch greater than the reference pitch. The second transistors are high-frequency transistors and the first transistors are logic transistors.

In another example aspect, the present disclosure provides a semiconductor circuit structure. The semiconductor circuit structure includes a semiconductor substrate having a first circuit region and a second circuit region; logic transistors that include first gate stacks disposed in the first circuit region, the first gate stacks having a first gate pitch; high-frequency transistors that include second gate stacks disposed in the second circuit region, the second gate stacks having a second gate pitch greater than the first gate pitch; a first dummy region surrounding the logic transistors and a second dummy region surrounding the high-frequency transistors; and a guard ring disposed between the second circuit region and the second dummy region. The first dummy region includes first dummy gates configured with a third gate pitch being equal to the first gate pitch; and the second dummy region includes second dummy gates configured with a fourth gate pitch being less than the second gate pitch.

In yet another example aspect, the present disclosure provides a semiconductor structure. The semiconductor structure includes a semiconductor substrate having a first circuit region and a second circuit region; logic transistors that include first gate stacks disposed in the first circuit region, the first gate stacks having a first gate pitch and a first gate height; high-frequency transistors that include second gate stacks disposed in the second circuit region, the second gate stacks having a second gate pitch greater than the first gate pitch and a second gate height less than the first gate height; a first dummy region surrounding the logic transistors and a second dummy region surrounding the high-frequency transistors; and a guard ring disposed between the second circuit region and the second dummy region. The first dummy region includes first dummy gates configured with a third gate pitch being equal to the first gate pitch, and the second dummy region includes second dummy gates configured with a fourth gate pitch being less than the second gate pitch.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A semiconductor circuit structure, comprising:
a semiconductor substrate having a first circuit region and a second circuit region;
active regions extended from the semiconductor substrate and surrounded by isolation features;
first transistors that include first gate stacks formed on the active regions and disposed in the first circuit region, the first gate stacks having a first gate pitch;
second transistors that include second gate stacks formed on the active regions and disposed in the second circuit region, the second gate stacks having a second gate pitch greater than the first gate pitch; and a dummy region surrounding the second transistors, wherein the dummy region includes first dummy gates configured next to the second gate stacks and having a third gate pitch being equal to the second gate pitch, and second dummy gates configured next to the first dummy gates and separated from the second gate stacks by the first dummy gates, the second dummy gates having a fourth gate pitch less than the second gate pitch.

2. The semiconductor circuit structure of claim 1, wherein the active regions are longitudinally oriented along a first direction;

the second gate stacks are longitudinally oriented along a second direction that is perpendicular to the first direction;

the first and second dummy gates are longitudinally oriented along the second direction; the first dummy gates are distanced from the second gate stacks along the second direction; and the second dummy gates are distanced from the first dummy gates along the second direction.

3. The semiconductor circuit structure of claim 2, further comprising third dummy gates distanced from the second gate stacks along the first direction, wherein the third dummy gates include a fifth gate pitch less than the second gate pitch;

the second dummy gates span a first dimension L1 along the second direction;

the third dummy gates span a second dimension L2 along the second direction; and L2 is less than L1.

4. The semiconductor circuit structure of claim 1, wherein the first gate stacks include a top portion with a trapezoid shape, and the second gate stacks include a top portion with round corners.

5. The semiconductor circuit structure of claim 1, wherein the first transistors are logic transistors;

the second transistors are high-frequency transistors; the first gate stacks include a first gate height; and the second gate stacks include a second gate height being less than the first gate height.

6. The semiconductor circuit structure of claim 1, further comprising third transistors that include third gate stacks formed on the active regions and disposed in a third circuit region of the semiconductor substrate, the third gate stacks having a third gate pitch different from the first and second gate pitches.

7. The semiconductor circuit structure of claim 1, wherein the active regions are fin active regions;

the second gate stacks each further include an upper portion above a top surface of the fin active regions and a lower portion below the top surface of the fin active regions; and the lower portion has an uneven profile in a sectional view.

8. The semiconductor circuit structure of claim 7, wherein the lower portion of each of the second gate stacks spans a first width W1 at a bottom surface, a second width W2 at a middle location, and a third width W3 at a top surface leveling with the top surface of the fin active region;

each of W1 and W3 is greater than W2; and

W3 is greater than W1.

9. The semiconductor circuit structure of claim 8, wherein the upper portion of each of the second gate stacks spans a fourth width W4 at a middle location, and fifth width W5 at a top surface; and each of W3 and W5 is greater than W4.

10. The semiconductor circuit structure of claim 1, further comprising multi-layer guard rings disposed between the second transistors and the dummy region, wherein the multi-layer guard rings include conductive features connected to a grounding line to bias the semiconductor substrate.

11. A semiconductor circuit structure, comprising:

a semiconductor substrate having a first circuit region and a second circuit region;

first transistors that include first gate stacks disposed in the first circuit region, the first gate stacks having a first gate pitch;

second transistors that include second gate stacks disposed in the second circuit region, the second gate stacks having a second gate pitch greater than the first gate pitch; and a guard ring structure configured to enclose the second transistors, wherein the guard ring structure further includes an inner guard ring surrounding the second transistors, a middle guard ring surrounding the inner guard ring, and an outer guard ring surrounding the middle guard ring, wherein the middle guard is distanced from the inner guard ring with a first spacing C1; and the outer guard is distanced from the middle guard ring with a second spacing C2 being greater than C1.

12. The semiconductor circuit structure of claim 11, wherein a ratio C2/C1 is greater than 1.5.

13. The semiconductor circuit structure of claim 11, further comprising a dummy region surrounding the guard ring structure, wherein the dummy region includes first dummy gates configured next to the second gate stacks and having a third gate pitch being equal to the second gate pitch; and second dummy gates configured next to the first dummy gates and separated from the second gate stacks by the first dummy gates, the second dummy gates having a fourth gate pitch less than the second gate pitch.

14. The semiconductor circuit structure of claim 11, wherein the first gate stacks include a first gate height and a top portion with a trapezoid shape; and the second gate stacks include a second gate height being less than the first gate height and a top portion with round corners.

15. The semiconductor circuit structure of claim 11, further comprising:

a dummy region surrounding the second transistors, wherein the dummy region includes first dummy gates configured next to the second gate stacks and having a third gate pitch being equal to the second gate pitch, and second dummy gates configured next to the first dummy gates and separated from the second gate stacks by the first dummy gates, the second dummy gates having a fourth gate pitch less than the second gate pitch.

16. A semiconductor circuit structure, comprising:

a semiconductor substrate having a first circuit region and a second circuit region;

first transistors that include first gate stacks disposed in the first circuit region, the first gate stacks having a first gate pitch and a first spacing; and second transistors that include second gate stacks disposed in the second circuit region, the second gate stacks having a second gate pitch greater than the first gate pitch and a second spacing greater than the first spacing, wherein the first gate stacks include a first gate height and a top portion with a trapezoid shape, and the second gate stacks include a second gate height being less than the first gate height and a top portion with round corners.

17. The semiconductor circuit structure of claim 16, further comprising:

a first dummy region surrounding the first transistors and a second dummy region surrounding the second transistors, wherein the first dummy region includes first dummy gates configured with a third gate pitch being equal to the first gate pitch; and the second dummy region includes second dummy gates configured with a fourth gate pitch being less than the second gate pitch.

18. The semiconductor circuit structure of claim 17, further comprising a guard ring disposed between the second circuit region and the second dummy region, wherein the guard ring includes conductive features connected to a grounding line to bias the semiconductor substrate.

19. The semiconductor circuit structure of claim 18, wherein the guard ring structure includes an inner guard ring surrounding the second transistors, a middle guard ring surrounding the inner guard ring, and an outer guard ring surrounding the middle guard ring;

the middle guard is distanced from the inner guard ring with a first spacing C1; and the outer guard is distanced from the middle guard ring with a second spacing C2 being greater than C1.

20. The semiconductor circuit structure of claim 16, further comprising:

a dummy region surrounding the second transistors, wherein the dummy region includes first dummy gates configured next to the second gate stacks and having a third gate pitch being equal to the second gate pitch, and second dummy gates configured next to the first dummy gates and separated from the second gate stacks by the first dummy gates, the second dummy gates having a fourth gate pitch less than the second gate pitch.

* * * * *